United States Patent
Nakazawa et al.

(10) Patent No.: US 12,392,805 B2
(45) Date of Patent: Aug. 19, 2025

(54) CURRENT MEASUREMENT COMPONENT, CURRENT MEASUREMENT DEVICE, AND CURRENT MEASUREMENT METHOD

(71) Applicant: HIOKI E.E. CORPORATION, Nagano (JP)

(72) Inventors: Koki Nakazawa, Nagano (JP); Hideo Watanabe, Nagano (JP); Yutaka Ashida, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 359 days.

(21) Appl. No.: 18/002,398

(22) PCT Filed: Jun. 2, 2021

(86) PCT No.: PCT/JP2021/021101
§ 371 (c)(1),
(2) Date: Dec. 19, 2022

(87) PCT Pub. No.: WO2021/261193
PCT Pub. Date: Dec. 30, 2021

(65) Prior Publication Data
US 2023/0228795 A1     Jul. 20, 2023

(30) Foreign Application Priority Data

Jun. 24, 2020 (JP) ................. 2020-109004
May 11, 2021 (JP) ................. 2021-080639

(51) Int. Cl.
*G01R 15/20* (2006.01)
(52) U.S. Cl.
CPC .................. *G01R 15/207* (2013.01)

(58) Field of Classification Search
CPC .. G01R 15/207; G01R 31/382; G01R 31/006; B60L 3/0046; H02H 3/17
(Continued)

(56) References Cited

U.S. PATENT DOCUMENTS

2006/0202704 A1* 9/2006 Satou ............... G01R 15/183
                                                                    324/546
2008/0106253 A1* 5/2008 Kojovic ............... H01F 5/003
                                                                    336/229
(Continued)

FOREIGN PATENT DOCUMENTS

JP     1979-078574 U     6/1979
JP     06-186346 A       7/1994
(Continued)

*Primary Examiner* — Huy Q Phan
*Assistant Examiner* — Trung Q Nguyen
(74) *Attorney, Agent, or Firm* — Conley Rose, P.C.

(57) ABSTRACT

A current measurement component including a bridging portion bridging a pair of side surface portions, a pair of coaxial components attached to the pair of side surface portions, respectively, each coaxial pair including an inner conductor that extends through a hole formed in a corresponding side surface portion of the pair of side surface portions, a connection portion electrically connecting the inner conductors of the pair of coaxial components, and a tube-like portion enclosing the connection portion with a gap formed between the tube-like portion and an outer peripheral portion of the connection portion. The pair of side surface portions and the bridging portion are electrically conductive and electrically connected, and the tube-like portion includes a base end portion electrically connected to a first side surface portion of the pair of side surface portions and a distal end portion electrically separated from the outer conductor of coaxial component pairs.

12 Claims, 12 Drawing Sheets

(58) Field of Classification Search
USPC ..... 324/126, 415–417, 425–437, 76.11, 500, 324/600
See application file for complete search history.

(56) References Cited

U.S. PATENT DOCUMENTS

| | | |
|---|---|---|
| 2009/0278527 A1 | 11/2009 | Perras |
| 2015/0109005 A1* | 4/2015 | Hernandez ......... G01R 1/06772 |
| | | 324/691 |
| 2016/0020534 A1* | 1/2016 | Paynter .................... H02G 1/14 |
| | | 439/578 |
| 2017/0244203 A1* | 8/2017 | Harwath ................. H01P 5/026 |
| 2018/0045762 A1* | 2/2018 | Shimizu ................. G01R 33/09 |

FOREIGN PATENT DOCUMENTS

| | | |
|---|---|---|
| JP | 07-280845 A | 10/1995 |
| JP | 10-38914 A | 2/1998 |
| JP | 11-14679 A | 1/1999 |
| JP | 2013-140719 A | 7/2013 |
| JP | 2015-200630 A | 11/2015 |
| JP | 2015-200631 A | 11/2015 |

* cited by examiner

CURRENT MEASUREMENT COMPONENT, CURRENT MEASUREMENT DEVICE, AND CURRENT MEASUREMENT METHOD

TECHNICAL FIELD

The present invention relates to a current measurement component, a current measurement device, and a current measurement method.

BACKGROUND ART

JP 1979-078574 U describes a current measurement device in which a measurement coil is attached to a measurement fitting connected to a return conductor of a coaxial cable, and the current flowing through the measurement fitting is measured.

SUMMARY OF INVENTION

With the current measurement device described above, current transmitted from a coaxial transmission path may be measured while a conductor is placed on the outer side of a current sensor configured of the measurement coil or the like. In such a case, the current sensor may be affected by factors such as the electric field and the electromagnetic field generated by a difference between an electrical potential at the conductor that runs along the outside of the current sensor and an electrical potential at the conductor that runs along the inside of the current sensor. This may cause a decrease in measurement accuracy.

The present invention is directed at solving such problems, and an object of the present invention is to accurately measure a current transmitted from a coaxial transmission path.

According to a first aspect of the present invention, a current measurement component includes a pair of side surface portions disposed spaced apart and opposing one another, a bridging portion bridging between the pair of side surface portions and forming a space between the pair of side surface portions, and a pair of coaxial components attached to the pair of side surface portions, respectively, each one of the pair of coaxial components including an inner conductor that extends through a hole portion formed in a corresponding side surface portion of the pair of side surface portions. The current measurement component further includes a connection portion electrically connecting the inner conductors of the pair of coaxial components, and a tube-like portion enclosing an outer peripheral portion of the connection portion with a gap formed between the tube-like portion and the outer peripheral portion of the connection portion. Also, the pair of side surface portions and the bridging portion are electrically conductive such that outer conductors of the pair of coaxial components are electrically connected, and the tube-like portion includes a base end portion electrically connected to a first side surface portion of the pair of side surface portions and a distal end portion electrically separated from the outer conductor of a coaxial component of the pair of coaxial components attached to a second side surface portion of the pair of side surface portions.

According to a second aspect, a current measurement component includes a pair of side surface portions disposed spaced apart and opposing one another, a bridging portion bridging between the pair of side surface portions and forming a space between the pair of side surface portions, a pair of coaxial components attached to the pair of side surface portions, respectively, each one of the pair of coaxial components including an inner conductor that extends through a hole portion formed in a corresponding side surface portion of the pair of side surface portions, a connection portion electrically connecting the inner conductors of the pair of coaxial components, and a tube-like portion enclosing an outer peripheral portion of the connection portion with a gap formed between the tube-like portion and the outer peripheral portion of the connection portion. In the current measurement component, outer conductors of the pair of coaxial components are electrically connected by using the pair of side surface portions and the bridging portion, a base end portion of the tube-like portion is electrically connected to a first side surface portion of the pair of side surface portions, and a distal end portion of the tube-like portion is electrically separated from the outer conductor of a coaxial component of the pair of coaxial components at a second side surface portion of the pair of side surface portions. The current measurement method is a method for measuring a current flowing through the coaxial components using the current measurement component and includes disposing a current sensor inside the space and enclosing the tube-like portion with the current sensor and detecting a current flowing through the connection portion with the current sensor.

According to these aspects, the base end portion of the tube-like portion is electrically connected to the outer conductor of the coaxial component, and the distal end portion of the tube-like portion is electrically separated from the outer conductor of the other coaxial component.

With such a configuration, the electrical potential at the outer conductor of one coaxial component, the tube-like portion, the pair of side surface portions, and the bridging portion and the electrical potential at the outer conductor of the other coaxial component can be made roughly the same. In addition, a current passing through the current sensor disposed in the current measurement component, that is, flowing through the inner conductor of the one coaxial component, the connection portion, and the inner conductor of the other coaxial component in this order can be prevented from passing through the current sensor, that is, turning back and flowing through the second electrode body of the outer conductor of the other coaxial component, the tube-like portion, and the outer conductor of the one coaxial component in this order.

Accordingly, a current can be measured with the current sensor disposed around the tube-like portion, and, in the current sensor, the effects of electric fields, electromagnetic fields, and the like caused by a difference between an electrical potential at the pair of side surface portions and the bridging portion and an electrical potential at the inner conductors of the coaxial components can be lessened.

Thus, a current transmitted from a coaxial transmission path connected to a current measurement component can be accurately measured.

DESCRIPTION OF EMBODIMENTS

Embodiments of the present invention will be described below with reference to the accompanying drawings.

First Embodiment

Figure 1:
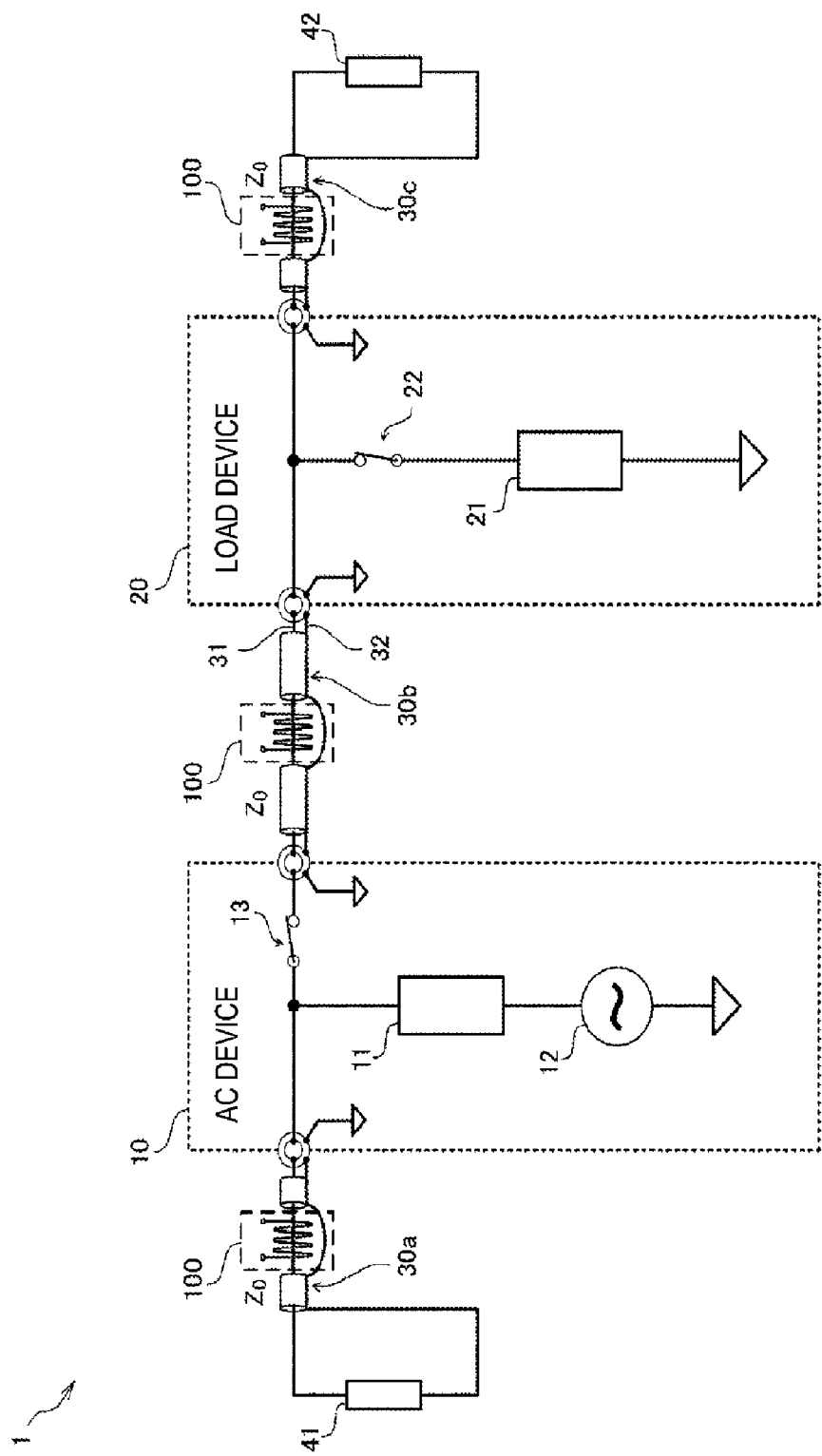
FIG. 1 is a diagram illustrating an example of a coaxial transmission system installed with a current measurement device according to a first embodiment of the present invention.

FIG. 1 is a diagram illustrating an example of a coaxial transmission system installed with a current measurement device according to the first embodiment.

A current measurement device 100 is a device for measuring the current transmitted through a coaxial transmission path (coaxial line) in a coaxial transmission system 1.

The coaxial transmission system 1 is a system for transmitting electrical signals through a coaxial transmission path connected to a plurality of devices. The coaxial transmission system 1 includes an alternating current (AC) device 10, a load device 20, a plurality of coaxial cables 30a to 30c, a termination resistor 41 on the signal source side, and a termination resistor 42 on the load side.

The AC device 10 is a device that generates an AC signal. The AC device 10 generates an alternating current ranging from several hertz (Hz) to several hundred hertz (MHz), for example. As illustrated in FIG. 1, the equivalent circuit of the AC device 10 can be represented by a signal source impedance 11 and an AC signal source 12.

In the present embodiment, the AC device 10 includes a switch 13 used for measuring the alternating current output from the AC signal source 12. The switch 13, for example, forms a connection between the AC signal source 12 and the load device 20 when an alternating current is supplied from the AC signal source 12 to the load device 20, and cuts the connection between the AC signal source 12 and the load device 20 when the alternating current of the AC signal source 12 is measured.

The AC device 10 is, for example, a power supply device for supplying AC power to the load device 20, or an analysis device for generating AC signals for transmission characteristic analysis. The AC device 10 supplies the generated AC signal to the load device 20 via the coaxial cable 30b.

The coaxial cable 30b is a coaxial transmission path including an inner conductor 31 and an outer conductor 32 disposed concentrically. In the coaxial cable 30b, a dielectric is disposed between the inner conductor 31 and the outer conductor 32. The interposing dielectric is, for example, an insulating member made of polyethylene or the like, or air. Also, the coaxial cable 30b has a characteristic impedance Z0 of 50Ω or 75Ω, for example. Similar to the coaxial cable 30b, the coaxial cables 30a and 30c each include the inner conductor 31 and the outer conductor 32.

The load device 20 is a device that operates by receiving AC signals supplied from the AC device 10 via the coaxial cable 30b. As illustrated in FIG. 1, the equivalent circuit of the load device 20 can be represented by a load impedance 21.

In the present embodiment, the load device 20 includes a switch 22 for measuring the AC signals supplied to the load impedance 21. The switch 22, for example, cuts the connection between the AC signal source 12 and the load device 20 when an alternating current supplied from the AC signal source 12 via the coaxial cable 30b is measured.

In the coaxial transmission system 1 described above, a plurality of the current measurement devices 100 according to the present embodiment are disposed at a plurality of points for specifying a failure point, for example. For example, the current measurement device 100 is disposed between the AC device 10 and the termination resistor 41 on the signal source side to measure the alternating current flowing through the coaxial cable 30a. Likewise, the current measurement device 100 is disposed between the AC device 10 and the load device 20 to measure the alternating current flowing through the coaxial cable 30b, and the current measurement device 100 is disposed between the load device 20 and the termination resistor 42 on the load side to measure the alternating current flowing through the coaxial cable 30c.

Next, the configuration of the current measurement device 100 according to the present embodiment will be described with reference to FIGS. 2 to 5. Hereinafter, the coaxial cables 30a to 30c are collectively referred to as a coaxial cable 30.

Figure 2:
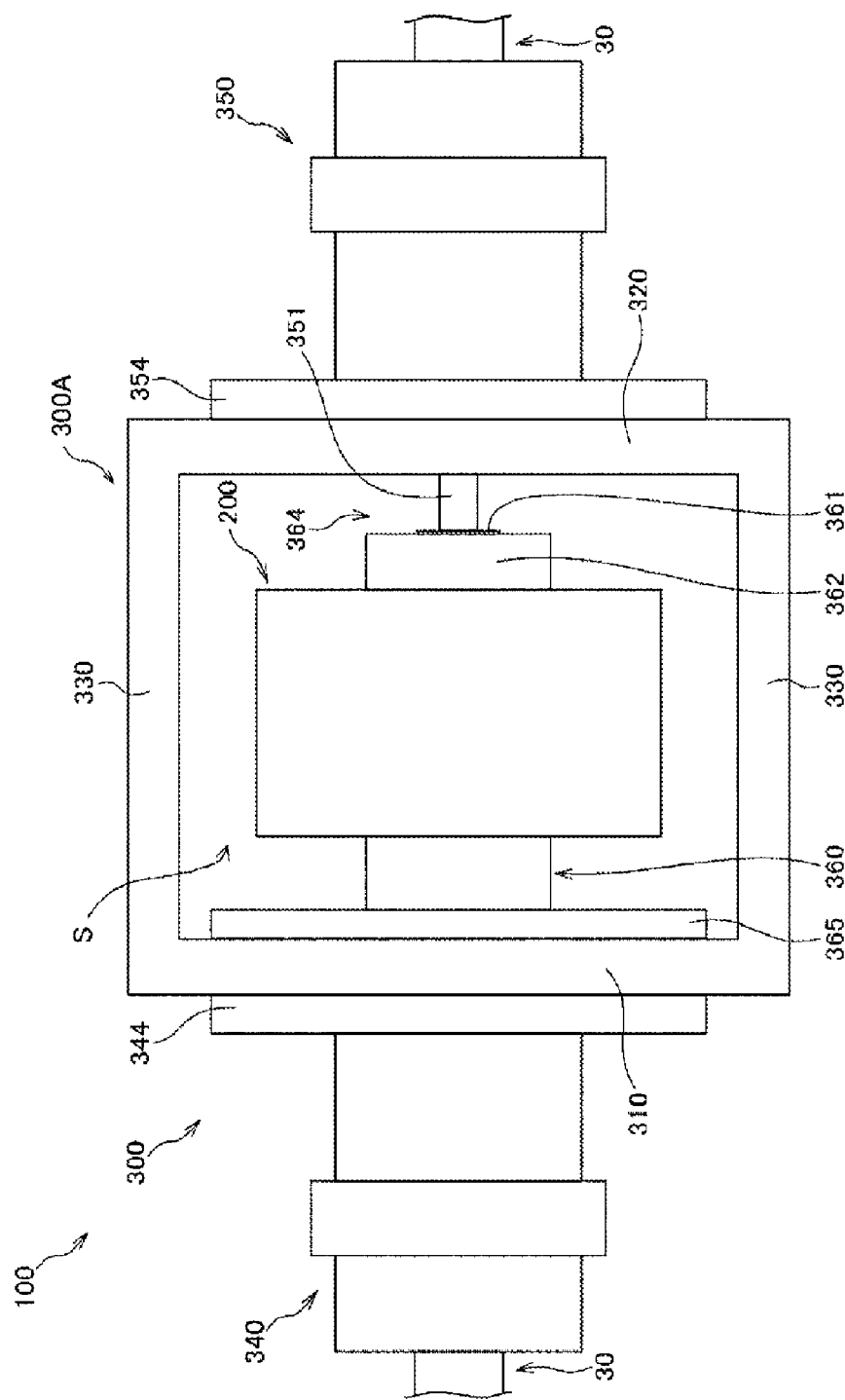
FIG. 2 is a side view illustrating the appearance of the current measurement device.
Figure 3:
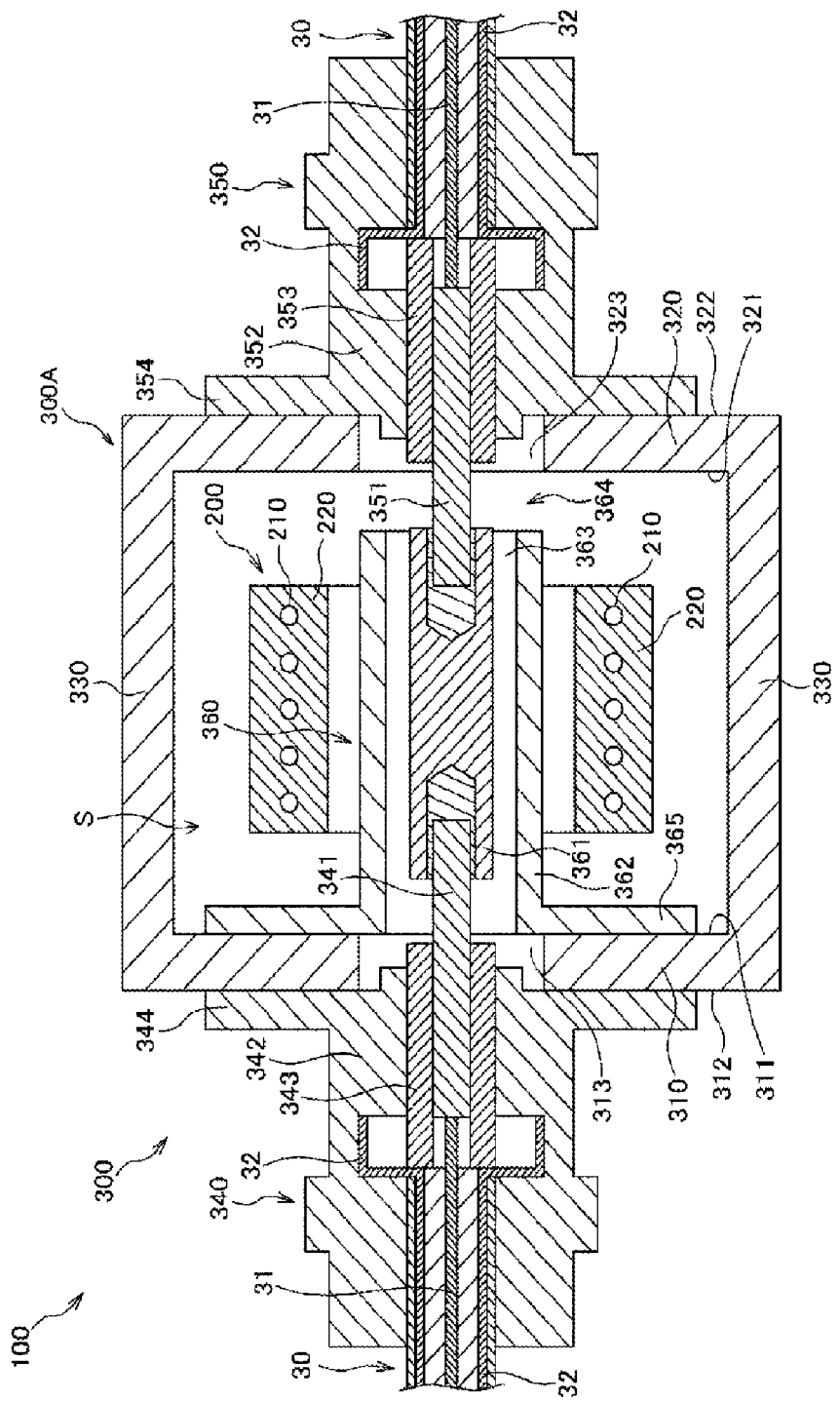
FIG. 3 is a cross-sectional view illustrating the structure of the current measurement device.
Figure 4:
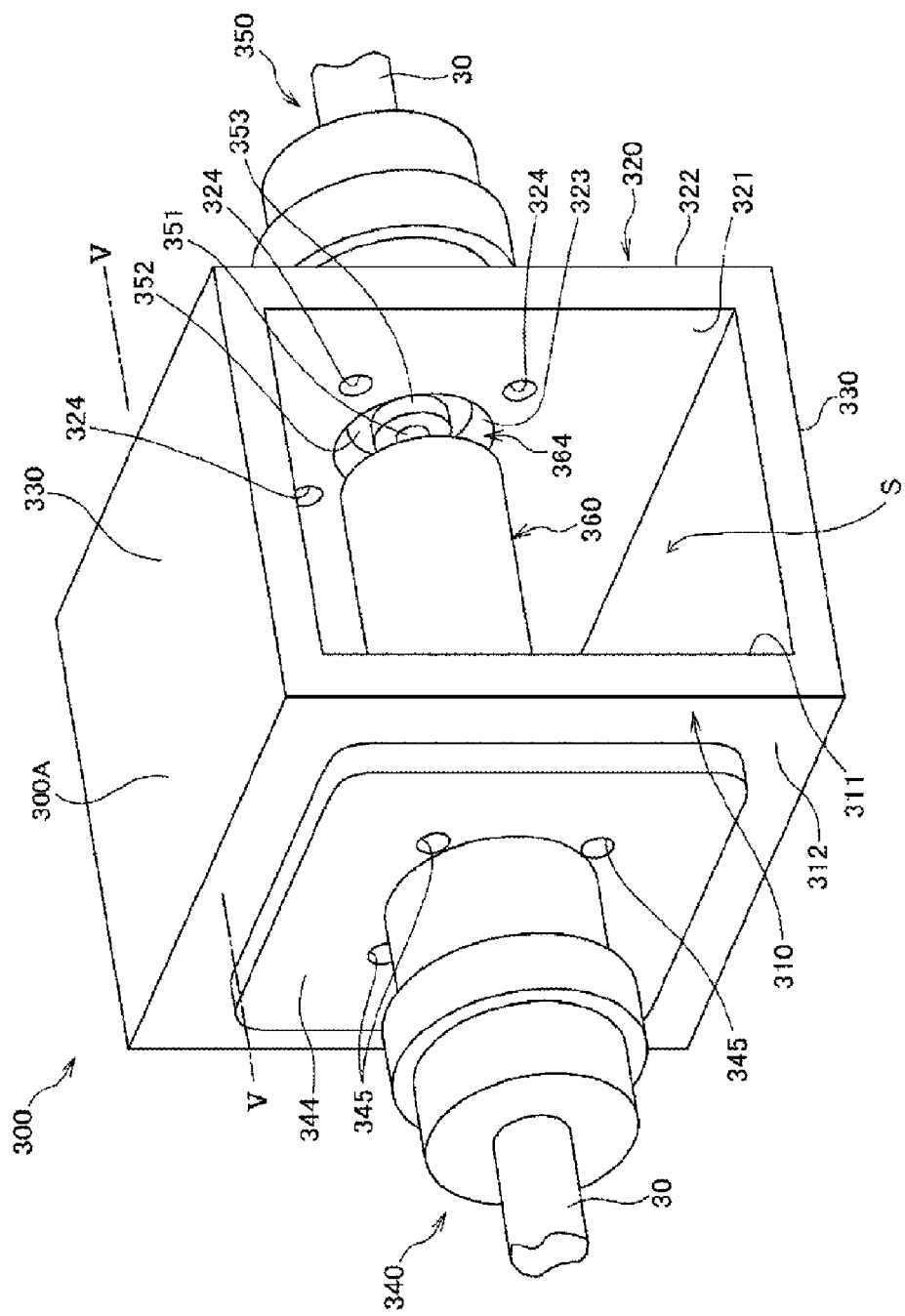
FIG. 4 is a perspective view illustrating the appearance of a current measurement instrument constituting the current measurement device.
Figure 5:
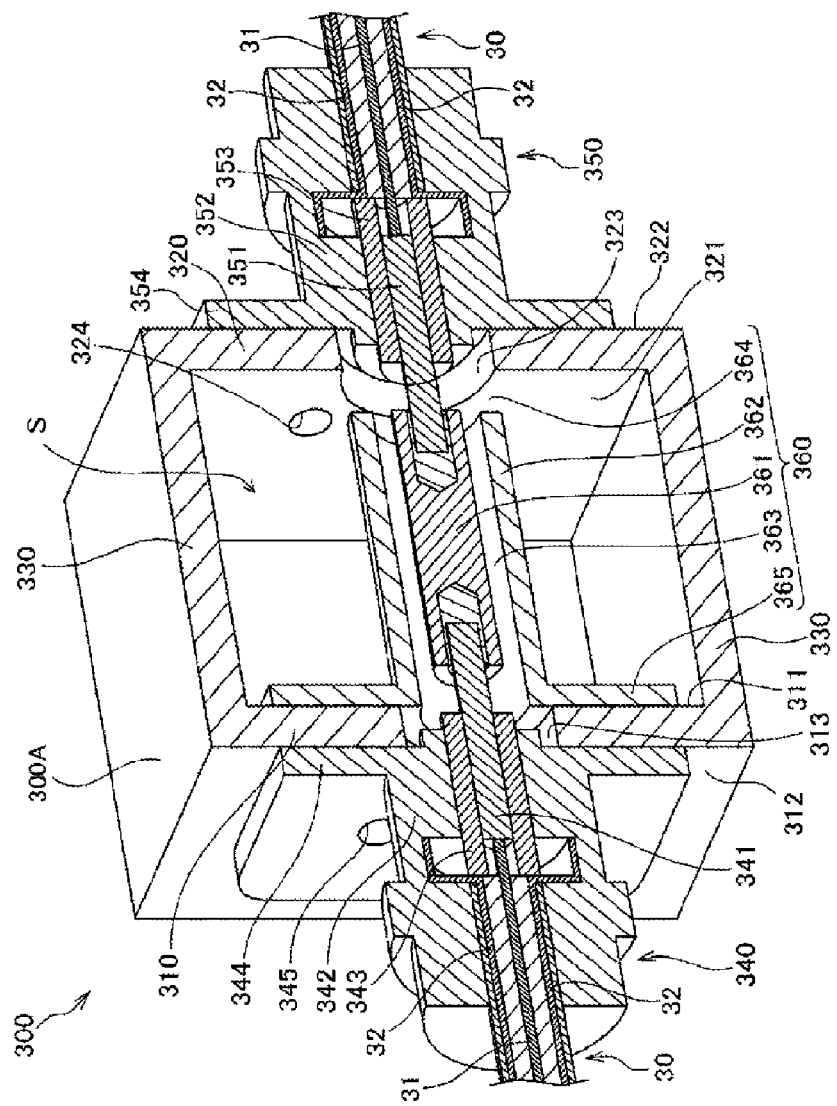
FIG. 5 is a cross-sectional view taken along line V-V illustrated in FIG. 4.

FIG. 2 is a side view illustrating the appearance of the current measurement device 100, and FIG. 3 is a cross-sectional view illustrating the internal structure of the current measurement device 100. FIG. 4 is a perspective view illustrating the appearance of a current measurement instrument 300 constituting the current measurement device 100, and FIG. 5 is a cross-sectional view of the current measurement instrument 300 taken along line V-V illustrated in FIG. 4.

As illustrated in FIGS. 2 and 3, the current measurement device 100 includes a current sensor 200 that detects current without contact, and the current measurement instrument 300 including a housing (frame body) 300A in which the current sensor 200 is installed.

As illustrated in FIG. 3, the current sensor 200 is a sensor that detects, without contact, an alternating current flowing through a measurement target such as an electrical path (electrical wire) through which the alternating current flows in a state in which the measurement target is inserted into an annular portion 220 of the current sensor 200. The current sensor 200 is connected to a measuring instrument, such as an oscilloscope or a spectrum analyzer, and, on the basis of a detection signal of the current sensor 200, the current measurement instrument measures the current flowing through the measurement target or a physical quantity such as the magnetic field produced from the measurement target.

The current sensor 200, for example, includes a coil 210 wound around the outer periphery of the measurement target, as illustrated in FIG. 3. Alternatively, the current sensor 200 may include a coil of lead wire wound around an annular magnetic core into which the measurement target is inserted. Furthermore, the current sensor 200 may be a clamp-type sensor with a structure that can clamp the measurement target, or may be a pass through-type sensor with a mounting structure.

The current measurement instrument 300 is a current measurement component for measuring the current flowing through the coaxial cable 30 by using the current sensor 200. As illustrated in FIGS. 4 and 5, the current measurement instrument 300 includes a transmission path 360 for transmitting an alternating current flowing through the coaxial cable 30 to the inside of the housing 300A for housing the current sensor 200.

The shape of the housing 300A is not limited to the rectangular tube-like shape illustrated in FIGS. 4 and 5 and may be a rectangular parallelepiped, a polygonal prism, or a tube-like shape such as a cylinder or an elliptic cylinder, for example. Further, the current measurement instrument 300 may be a structure that cannot be disassembled, or may be a structure that can be assembled to run the transmission path 360 through the annular portion 220 of the pass through-type current sensor 200.

The current measurement instrument 300 includes a pair of side surface portions 310 and 320 for housing the current sensor 200, a bridging portion 330 bridging between the pair of side surface portions 310 and 320, and a pair of coaxial connectors 340 and 350 attached to the pair of side surface portions 310 and 320. Furthermore, the current measurement instrument 300 includes the transmission path 360 described above, and the transmission path 360 is inserted into the annular portion 220 of the current sensor 200 as illustrated in FIG. 3.

The pair of side surface portions 310 and 320 constituted by the first side surface portion 310 and the second side surface portion 320 are spaced apart from one another and disposed opposing one another.

In the present embodiment, the pair of side surface portions 310 and 320 are plate-like members and are disposed opposing one another. Also, the pair of side surface portions 310 and 320 are conductors and are made of an electrically-conductive metal such as stainless steel, for example.

Since the pair of side surface portions 310 and 320 are provided, a space (installment space) S required for installing the current sensor 200 is formed between the first side surface portion 310 and the second side surface portion 320. This allows the current sensor 200 to be physically separated from electrical paths, electronic components, and other components that are not the measurement target.

Also, as illustrated in FIG. 3, a pair of opposing hole portions 313 and 323 are formed in the pair of side surface portions 310 and 320, respectively. A pin 341, which is the inner conductor of the coaxial connector 340, extends through one hole portion 313. Likewise, a pin 351, which is the inner conductor of the coaxial connector 350, extends through the other hole portion 323.

Furthermore, as illustrated in FIGS. 4 and 5, a plurality of threaded holes 324 used to attach the coaxial connector 350 are formed in the side surface portion 320. In a similar manner to the side surface portion 320, a plurality of threaded holes are also formed in the side surface portion 310.

The bridging portion 330 bridges between the pair of side surface portions 310 and 320 and forms the space S between the pair of side surface portions 310 and 320.

In the present embodiment, the bridging portion 330 is constituted by plate-like members that oppose one another. Specifically, the bridging portion 330 bridges between one end portion of the side surface portion 310 and one end portion of the side surface portion 320, and bridges between the other end portion of the side surface portion 310 and the other end portion of the side surface portion 320. In a similar manner to the pair of side surface portions 310 and 320, the bridging portion 330 is a conductor and is made of an electrically-conductive metal, for example.

The bridging portion 330 of the present embodiment is constituted by two plate-like members opposing one another. However, the bridging portion 330 may be constituted by one or three plate-like members or may be constituted by a tube-like member. Also, in the present embodiment, to insert the current sensor 200, the bridging portion 330 is formed such that a part of the outer periphery of the bridging portion 330 is open. However, the bridging portion 330 may be formed covering the entire periphery of the current sensor 200.

The pair of coaxial connectors 340 and 350 are constituted by the first coaxial connector 340 and the second coaxial connector 350, and the pair of coaxial connectors 340 and 350 are coaxial components for connecting the coaxial cable 30 to the transmission path 360 inside the housing 300A.

In a similar manner to the coaxial cable 30, the coaxial connectors 340 and 350 each include an inner conductor and an outer conductor disposed coaxially. The coaxial connectors 340 and 350 are each constituted by a BNC connector, an SMA connector, an SMB connector, a TNC connector, an N connector, an M connector, or an F connector, for example.

In the present embodiment, the coaxial connectors 340 and 350 share the same configuration, and the coaxial connectors 340 and 350 are connected to ends of the pair of coaxial cables 30, respectively. In the example illustrated in FIGS. 3 and 5, the structure for joining the coaxial connectors 340 and 350 and the coaxial cables 30 is simplified. Examples of a joining method that can be used include a screw method, a bayonet lock method, and a snap-lock method.

The coaxial connector 340 includes the pin 341, which is the inner conductor; a body portion 342, which is the outer conductor; a dielectric layer 343 for insulating the pin 341 from the body portion 342; and a flange 344 that projects from a distal end portion of the body portion 342 in a radial direction.

The inner conductor 31 of the coaxial cable 30 is electrically connected to the pin 341 of the coaxial connector 340, and the outer conductor 32 of the coaxial cable 30 is electrically connected to the body portion 342. Also, as illustrated in FIG. 4, a plurality of threaded holes 345 used to fix the coaxial connector 340 to the side surface portion 310 are formed in the flange 344. The coaxial connector 340 is fixed to an outer surface 312 of the side surface portion 310 by inserting screws into the threaded holes 345.

As illustrated in FIGS. 3 and 5, in a similar manner to the coaxial connector 340, the coaxial connector 350 includes the pin 351, which is the inner conductor; a body portion 352, which is the outer conductor; a dielectric layer 353 for insulating the pin 351 from the body portion 352; and a flange 354 that projects from a distal end portion of the body portion 352 in the radial direction. The pin 351, the body portion 352, the dielectric layer 353, and the flange 354 are similar in configuration to those of the coaxial connector 340, and thus these components will not be described.

The pair of coaxial connectors 340 and 350 are attached to the pair of side surface portions 310 and 320, respectively, and include the pins 341 and 351 which function as inner conductors that extend through the hole portions 313 and 323 formed in the corresponding side surface portion. That is, the pair of coaxial connectors 340 and 350 are attached to the outer surfaces 312 and 322 of the pair of side surface portions 310 and 320, with the pins 341 and 351 passing through the hole portions 313 and 323, respectively.

Specifically, the coaxial connector 340 is attached to the outer surface 312 of the side surface portion 310 with the pin 341 extending through the hole portion 313 of the side surface portion 310. This brings the flange 344 of the coaxial connector 340 into contact with the outer surface 312 of the side surface portion 310.

In a similar manner, the coaxial connector 350 is attached to the outer surface 322 of the side surface portion 320 with the pin 351 extending through the hole portion 323 of the side surface portion 320. This brings the flange 354 of the coaxial connector 350 into contact with the outer surface 322 of the side surface portion 320. Herein, the outer surfaces 312 and 322 refer to the surfaces of the pair of side surface portions 310 and 320 on the side opposite to inner surfaces 311 and 321, which are surfaces opposing one another, respectively.

As described above, the pair of side surface portions 310 and 320 and the bridging portion 330 constituting the housing 300A are electrically conductive such that the body portions 342 and 352 of the pair of coaxial connectors 340 and 350 are electrically connected. Thus, the outer conductors of the pair of coaxial connectors 340 and 350 are electrically connected via the pair of side surface portions 310 and 320 and the bridging portion 330. This suppresses noise entering the space S inside the housing 300A from outside the current measurement instrument 300.

Next, the configuration of the transmission path 360 provided in the current measurement instrument 300 will be described.

As illustrated in FIG. 5, the transmission path 360 includes a connection portion 361 that electrically connects the inner conductors of the pair of coaxial connectors 340 and 350, and a tube-like portion 362 disposed away from the outer peripheral portion of the connection portion 361. A hollow portion 363 is formed between the connection portion 361 and the tube-like portion 362.

The transmission path 360 further includes a flange 365 that projects from the base end portion of the tube-like portion 362 in the radial direction. The flange 365 is fixed to the inner surface 311 of the side surface portion 310.

The connection portion 361 is an electrical path that electrically connects the pins 341 and 351 of the pair of coaxial connectors 340 and 350 to transmit electrical signals that flow through the inner conductor 31 of the coaxial cable 30.

In the present embodiment, the connection portion 361 is formed in a cylindrical shape. Also, the connection portion 361 is a conductor and is made of a metal such as copper, for example. A hole is formed in either end of the connection portion 361 in the longitudinal direction. The pin 341 of the coaxial connector 340 is inserted into one of the holes of the connection portion 361, and the pin 351 of the coaxial connector 350 is inserted into the other hole of the connection portion 361. The connection portion 361 is joined to both of the pins 341 and 351 by using a solder, for example.

Alternatively, the connection portion 361 and the pins 341 and 351 may be joined via threaded holes formed in both ends of the connection portion 361 and the pins 341 and 351 formed as male screws or via the pins 341 and 351 being press-fit into both the holes in the connection portion 361. Also, instead of a cylindrical shape, the connection portion 361 may be formed in a polygonal prism shape or an elliptical prism shape.

The tube-like portion 362 is a member for suppressing noise, such as electric fields and electromagnetic fields, that is radially emitted (radiated) from the outer periphery of the connection portion 361 and for reducing noise entering the connection portion 361 from outside the tube-like portion 362. The tube-like portion 362 is inserted into the annular portion 220 of the current sensor 200 as illustrated in FIG. 3.

The tube-like portion 362 encloses the outer peripheral portion of the connection portion 361, with a gap formed between the tube-like portion 362 and the outer peripheral portion of the connection portion 361. Also, the base end portion of the tube-like portion 362 is electrically connected to the first side surface portion 310, and the distal end portion of the tube-like portion 362 is electrically separated from the body portion 352, which is the outer conductor of the coaxial connector 350 attached to the second side surface portion 320.

In the present embodiment, to electrically separate the distal end portion of the tube-like portion 362 from the body portion 352 of the coaxial connector 350, a gap 364 is formed in the transmission path 360 so as to cut the electrical connection between the body portions 342 and 352 of the pair of coaxial connectors 340 and 350.

Accordingly, a current passing through the current sensor 200 with the tube-like portion 362 inserted, that is, flowing through the pin 341 of the coaxial connector 340, the connection portion 361, and the pin 351 of the coaxial connector 350 in this order can be prevented from passing through the current sensor 200, that is, flowing back (turning back) through the body portion 352 of the coaxial connector 350, the tube-like portion 362, and the body portion 342 of the coaxial connector 340 in this order.

Thus, it is possible to suppress cancellation of the magnetic field produced by the current flowing through the pin 341 of the coaxial connector 340, the connection portion 361, and the pin 351 of the coaxial connector 350 by the magnetic field produced by the return current flowing through the body portion 352 of the coaxial connector 350, the tube-like portion 362, and the body portion 342 of the coaxial connector 340.

In this manner, a magnetic field centered around the connection portion 361 at which the alternating current flows is produced in the space S inside the current measurement instrument 300, and the current sensor 200 can detect the magnetic field produced by the alternating current flowing through the connection portion 361.

The tube-like portion 362 is a conductor and is made of a metal such as copper, for example. Also, the tube-like portion 362 is formed in a cylindrical shape. Instead of a cylindrical shape, the tube-like portion 362 may be formed in a polygonal prism shape or an elliptic cylinder shape, for example.

As illustrated in FIGS. 3 and 5, the tube-like portion 362 extends from the inner surface 311 of the side surface portion 310 toward the inner surface 321 of the side surface portion 320 and is spaced apart from the side surface portion 320 to form the gap 364.

By providing the gap 364 at or near the hole portion 323 of the side surface portion 320, the current sensor 200 can be separated from the gap 364. Thus, noise, such as electric fields and electromagnetic fields, emitted from the exposed connection portion 361 toward current sensor 200 can be reduced.

The gap 364 provided at the distal end of the tube-like portion 362 is designed to be narrower than the length (width) of the current sensor 200 in the longitudinal direction between the pair of side surface portions 310 and 320. Accordingly, the length of the connection portion 361 exposed from the tube-like portion 362 is relatively short, and thus noise, such as electric fields and electromagnetic fields, emitted from the exposed connection portion 361 can be reduced.

By providing the gap 364 at the distal end of the tube-like portion 362, the electrical connection between the body portions 342 and 352 of the pair of coaxial connectors 340 and 350 is cut and the characteristic impedance of the transmission path 360 can be easily adjusted to the same orientation and magnitude as those of the characteristic impedance Z0 of the coaxial cable 30.

In the present embodiment, as described above, the distal end of the tube-like portion 362 is formed spaced apart from the inner surface 321 of the side surface portion 320. However, no such limitation is intended.

For example, in a case in which the side surface portion 320 is thick and the inner diameter of the hole portion 323 is greater than the outer diameter of the tube-like portion 362, as long as the tube-like portion 362 and the body portion 352 of the coaxial connector 350 do not come into contact, the distal end of the tube-like portion 362 may further extend beyond the inner surface 321 of the side surface portion 320. In this case, the distal end of the tube-like portion 362 is formed spaced apart from at least the body portion 352 of the coaxial connector 350.

Also in the present embodiment, the tube-like portion 362 is attached to the inner surface 311 of the side surface portion 310. However, the tube-like portion 362 may be attached to the inner surface 321 of the side surface portion 320. In this case, the distal end of the tube-like portion 362 is formed extending from the side surface portion 320 toward the side surface portion 310 and spaced apart from the body portion 342 of the coaxial connector 340.

Next, the electrical characteristics of the current measurement instrument 300 according to the present embodiment will be described with reference to FIGS. 6 and 7.

Figure 6:
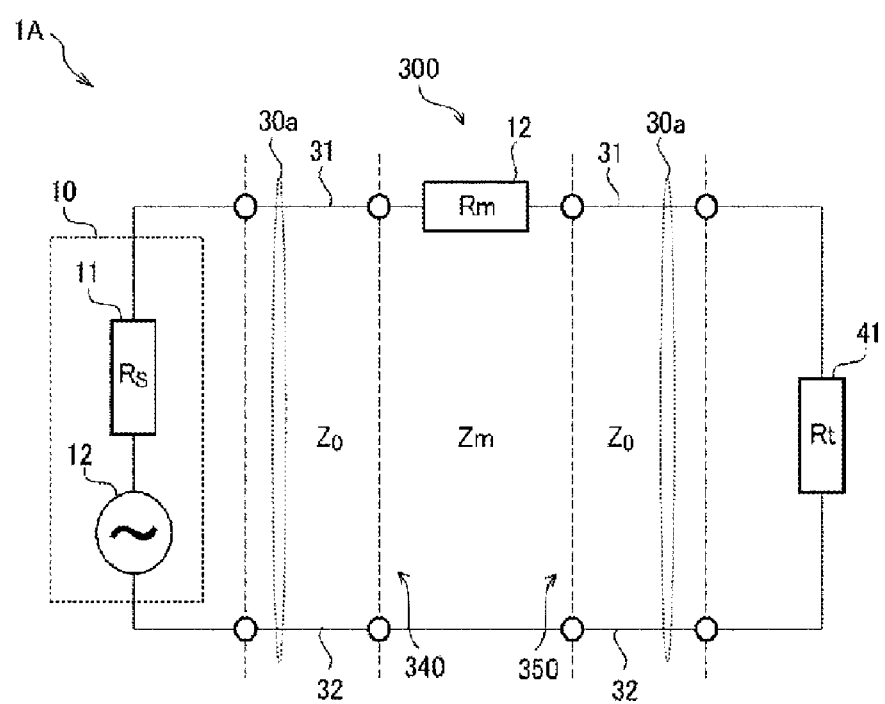
FIG. 6 is a circuit diagram illustrating an example of an equivalent circuit in a measurement system installed with the current measurement device.

FIG. 6 is a circuit diagram illustrating an equivalent circuit of a measurement system 1A. The measurement system 1A is the part of the coaxial transmission system 1 illustrated in FIG. 1 where the current measurement device 100 is disposed on the coaxial cable 30a connecting the AC device 10 and the termination resistor 41 on the signal source side.

A resistor Rm and characteristic impedance Zm of the current measurement instrument 300 constituting the current measurement device 100, the characteristic impedance Z0 of the pair of coaxial cables 30a connected to the current measurement instrument 300, and a resistor Rt of the termination resistor 41 are illustrated in FIG. 6.

In the measurement system 1A, to suppress reflection of the alternating current output from the AC signal source 12 at the termination resistor 41, the resistor Rt of the termination resistor 41 is set to the same value as the signal source impedance 11.

To suppress power loss in the alternating current transmitted from the AC signal source 12 to the termination resistor 41, the resistor Rm of the current measurement instrument 300 is set to a low value to give a resistance value of zero (0). Also, the characteristic impedance Zm of the current measurement instrument 300 is designed to have the same value as the characteristic impedance Z0 of the coaxial cable 30a. This makes it possible to accurately measure the alternating current flowing through the coaxial cable 30a in the current measurement instrument 300.

In the present embodiment, the impedance of the current measurement instrument 300 can be adjusted by adjusting the gap 364 for insulating the tube-like portion 362 from the coaxial connector 350, the distance between the connection portion 361 and the tube-like portion 362, and the dielectric inserted between the connection portion 361 and the tube-like portion 362. By adjusting the structure of the connection portion 361 and the tube-like portion 362 constituting the transmission path 360 in this manner, the characteristic impedance Zm of the current measurement instrument 300 can be adjusted to the characteristic impedance Z0 of the coaxial cable 30.

Accordingly, since the characteristic impedance Zm of the current measurement instrument 300 can be adjusted by adjusting the gap 364 of the tube-like portion 362, the distance between the tube-like portion 362 and the connection portion 361, and the like, the impedance between the AC device 10 and the termination resistor 41 can be easily made consistent.

Figure 7:
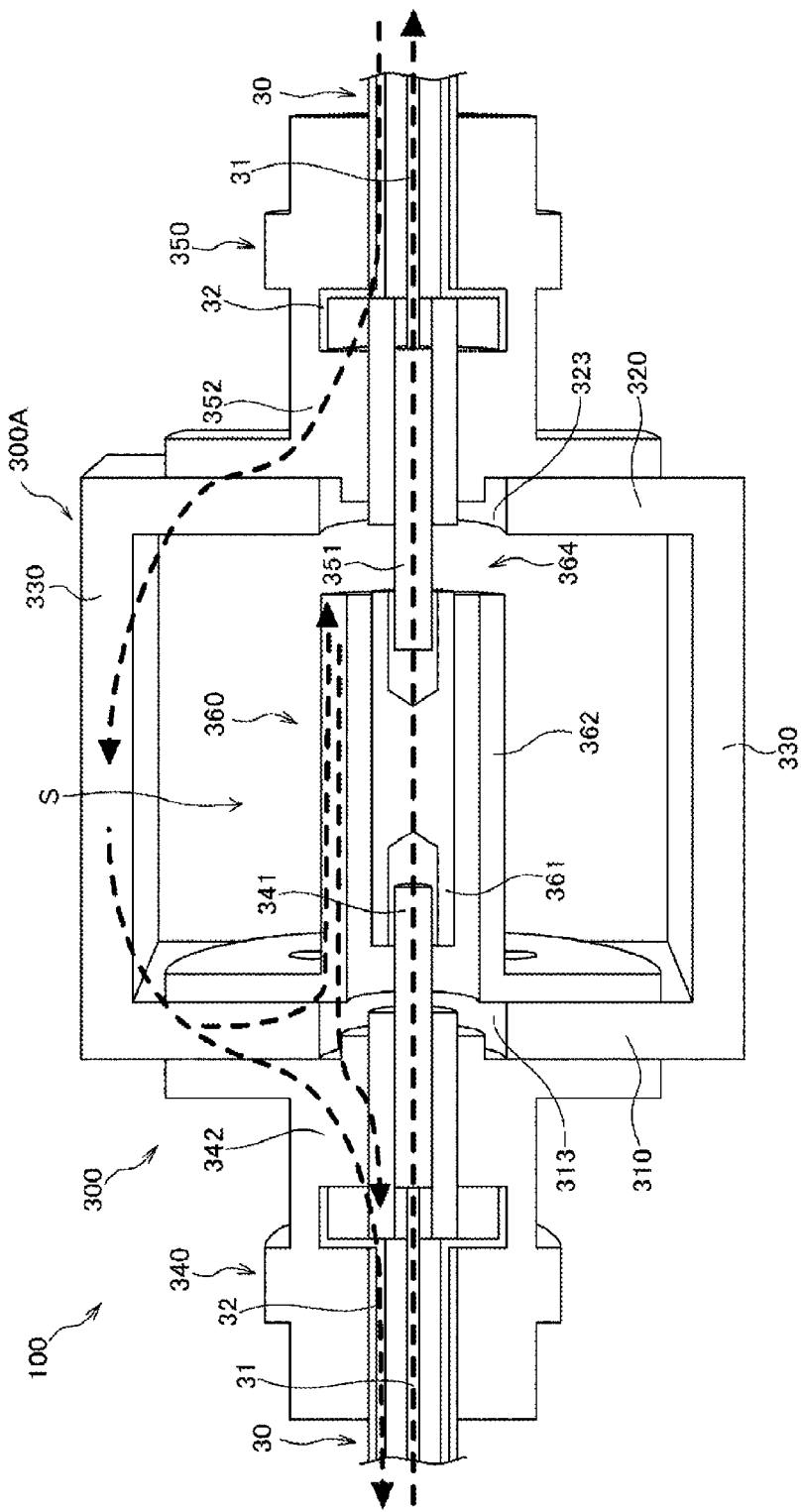
FIG. 7 is a conceptual diagram illustrating a current path of the current measurement instrument.

FIG. 7 is a conceptual diagram illustrating the path of the current flowing through the current measurement instrument 300 when the alternating current flowing through the coaxial cable 30a is positive (+).

First, the current flowing through the inner conductor 31 of one of the coaxial cables 30a is transmitted through the pin 341 of the coaxial connector 340, the connection portion 361, and the pin 351 of the coaxial connector 350 in this order to the inner conductor 31 of the other of the coaxial cables 30a. Then, the current flows, via the termination resistor 41, from the outer conductor 32 of the other of the coaxial cables 30a toward the body portion 352 of the coaxial connector 350.

Here, since the housing 300A constituted by the pair of side surface portions 310 and 320 and the bridging portion 330 is electrically conductive, the body portions 342 and 352 of the pair of coaxial connectors 340 and 350 are electrically connected. Thus, as illustrated in FIG. 7, the current flows from the body portion 352 of the coaxial connector 350, through the pair of side surface portions 310 and 320 and the bridging portion 330, to the body portion 342 of the coaxial connector 340.

Also, since the tube-like portion 362 is electrically conductive like the housing 300A, the current also flows from the body portion 342 of the coaxial connector 340 through the tube-like portion 362. As a result, the electrical potential at the housing 300A and the electrical potential at the tube-like portion 362 are roughly the same. Accordingly, the tube-like portion 362 with roughly the same electrical potential as the housing 300A blocks noise, such as electric fields and electromagnetic fields, produced between the housing 300A and the connection portion 361. Thus, electric fields and electromagnetic fields emitted as noise from the connection portion 361 to the space S inside the housing 300A can be suppressed.

Also, since the body portion 352 of the coaxial connector 350 and the tube-like portion 362 are not in contact due to the gap 364, a magnetic field produced by the current flowing through the connection portion 361 can be produced in the space S housing the current sensor 200.

By providing the gap 364 at the distal end of the tube-like portion 362 in this manner, a magnetic field produced by the current flowing through the connection portion 361 can be produced on the inner side of the annular portion 220 of the current sensor 200, and the electrical potentials around the current sensor 200 can be made roughly the same. Thus, since the space S inside the housing 300A is put in a state in which it is difficult for noise to enter the current sensor 200, the current sensor 200 can accurately detect a magnetic field produced by the current flowing through the connection portion 361.

Noise produced in the space S in the current measurement instrument 300 will now be described in detail. First, in a configuration in which the electrically-conductive tube-like portion 362 is not provided around the connection portion 361, a difference between an electrical potential at the housing 300A and an electrical potential at the connection portion 361 may cause noise, such as electric fields and electromagnetic fields, to be produced in the space S inside the current measurement instrument 300. This noise may impair the detection accuracy of the current sensor 200 disposed in the space S.

In contrast, in the present embodiment, the tube-like portion 362 is provided around the outer peripheral portion of the connection portion 361, and the tube-like portion 362 and the housing 300A are electrically connected. Thus, the difference between the electrical potential at the housing 300A and the electrical potential at the tube-like portion 362 is roughly zero, and so noise, such as electric fields and electromagnetic fields as described above, is less likely to be produced in the space S where the current sensor 200 is disposed. Accordingly, noise entering the current sensor 200 can be suppressed, unlike in a configuration without the tube-like portion 362.

Next, the effects of the first embodiment will be described.

In the present embodiment, the current measurement instrument 300 constituting a current measurement component includes the pair of side surface portions 310 and 320 disposed spaced apart and opposing one another, and the bridging portion 330 bridging between the pair of side surface portions 310 and 320. The current measurement instrument 300 also includes a pair of coaxial components that are attached to the pair of side surface portions 310 and 320, respectively, and include inner conductors that extend through the hole portions 313 and 323 formed in the corresponding side surface portions 310 and 320. Examples of a pair of coaxial components include a coaxial connector constituted by an inner conductor and an outer conductor formed on the outer periphery of the inner conductor, or a terminator. The coaxial components in the present embodiment correspond to the pair of coaxial connectors 340 and 350 including the pins 341 and 351 that function as inner conductors, respectively. The current measurement instrument 300 further includes the connection portion 361 that electrically connects the pins 341 and 351 of the pair of coaxial connectors 340 and 350.

The current measurement instrument 300 further includes the tube-like portion 362 that encloses the outer peripheral portion of the connection portion 361, with a gap formed between the tube-like portion 362 and the outer peripheral portion of the connection portion 361. Also, the pair of side surface portions 310 and 320 and the bridging portion 330 are electrically conductive such that the body portions 342 and 352 functioning as the outer conductors of the pair of coaxial connectors 340 and 350 are electrically connected. Furthermore, the tube-like portion 362 includes the base end portion electrically connected to the first side surface portion 310 and the distal end portion electrically separated from the body portion 352 of the one coaxial connector 350 attached to the second side surface portion 320.

According to the configuration described above, the bridging portion 330 is provided between the pair of side surface portions 310 and 320. This allows an electrical path, electronic component, or the like different from the coaxial cable 30 connected to at least one of the coaxial connectors 340 and 350 to be physically separated from the connection portion 361 inside the current measurement instrument 300. Thus, noise produced in the space S formed by the pair of side surface portions 310 and 320 and the bridging portion 330 can be reduced. This allows the current transmitted from a coaxial transmission path such as the coaxial cable 30 to the current measurement instrument 300 to be accurately measured.

Also, since the pair of side surface portions 310 and 320 and the bridging portion 330 are electrically conductive, the body portions 342 and 352 of the pair of coaxial connectors 340 and 350 are electrically connected. This makes it easier to block noise that may enter from outside of the current measurement instrument 300. Furthermore, since the tube-like portion 362 is disposed spaced apart from the outer peripheral portion of the connection portion 361, electric fields and electromagnetic fields produced from the connection portion 361 can be kept inside the tube-like portion 362.

As illustrated in FIG. 7, the pair of side surface portions 310 and 320, the bridging portion 330 and the tube-like portion 362 are electrically connected, making the space S roughly equipotential. Accordingly, noise caused by a difference between an electrical potential at the pair of side surface portions 310 and 320 and the bridging portion 330 and an electrical potential at the tube-like portion 362 can be reduced.

Also, since the gap 364 is provided at the distal end of the tube-like portion 362, a current passing through the current sensor 200, that is, a current flowing through the pin 341 of the one coaxial connector 340, the connection portion 361, and the pin 351 of the other coaxial connector 350 in this order can be prevented from passing through the current sensor 200, that is, flowing back through the body portion 352 of the other coaxial connector 350, the tube-like portion 362, and the body portion 342 of the one coaxial connector 340 in this order. Thus, the current flowing through the connection portion 361 can produce a magnetic field centered around the connection portion 361 in the space S inside the current measurement instrument 300.

In this manner, since the tube-like portion 362 is provided around the outer peripheral portion of the connection portion 361 and the tube-like portion 362 is electrically connected to the pair of side surface portions 310 and 320 and the bridging portion 330, noise entering the space S inside the current measurement instrument 300 can be reduced. Accordingly, the current flowing through the connection portion 361 can be accurately measured.

Also, in the present embodiment, the current measurement device 100 includes the current sensor 200 that detects a current flowing through a measurement target in a state in which the measurement target is inserted into the current sensor 200 and the current measurement instrument 300 described above. The bridging portion 330 forms the space S between the pair of side surface portions 310 and 320, and the current sensor 200 is disposed inside the space S while enclosing the tube-like portion 362 and detects the current transmitted through the connection portion 361.

According to this configuration, providing the bridging portion 330 between the pair of side surface portions 310 and 320 ensures the space S for disposing the current sensor 200. Accordingly, an electrical path or electronic component other than the coaxial cable 30 that transmits the current to the connection portion 361 can be physically separated from the current sensor 200. Thus, noise entering the current sensor 200 can be reduced, which in turn improves measurement accuracy when using the current sensor 200 to measure the current flowing through the connection portion 361.

Also, in the present embodiment, the structure of the tube-like portion 362 and the connection portion 361 is configured to have the same characteristic impedance as that of the coaxial connectors 340 and 350. This makes it possible to reduce the reflection that occurs at the current measurement instrument 300 when a high-frequency current flows through the coaxial cable 30. Accordingly, a current transmitted from the coaxial cable 30 to the connection portion 361 of the current measurement instrument 300 can be accurately measured.

Also, in the present embodiment, the pair of side surface portions 310 and 320 and the bridging portion 330 are conductors. According to this configuration, the current measurement instrument 300 can be easily manufactured without requiring a process of attaching conduction portions to the surfaces of the pair of side surface portions 310 and 320 and the bridging portion 330 or a process of applying a conductive material.

In addition, in the present embodiment, the gap 364 formed at the distal end of the tube-like portion 362 in the direction between the pair of side surface portions 310 and 320, i.e., the longitudinal direction of the connection portion 361 is narrower than the width of the current sensor 200. According to this configuration, the exposed portion of the connection portion 361 can be reduced, and thus noise, such as electric fields and electromagnetic fields, radiated from the exposed portion can be reduced.

Also, in the present embodiment, the tube-like portion 362 extends from the inner surface 311 of the first side surface portion 310 and is spaced apart from the second side surface portion 320 to form the gap 364. According to this configuration, since the gap 364 is formed at or near the second side surface portion 320, the current sensor 200 can be disposed separated from the gap 364. Thus, noise, such as electric fields and electromagnetic fields, emitted from the exposed connection portion 361 toward current sensor 200 can be reduced.

Modified Example

Figure 8:
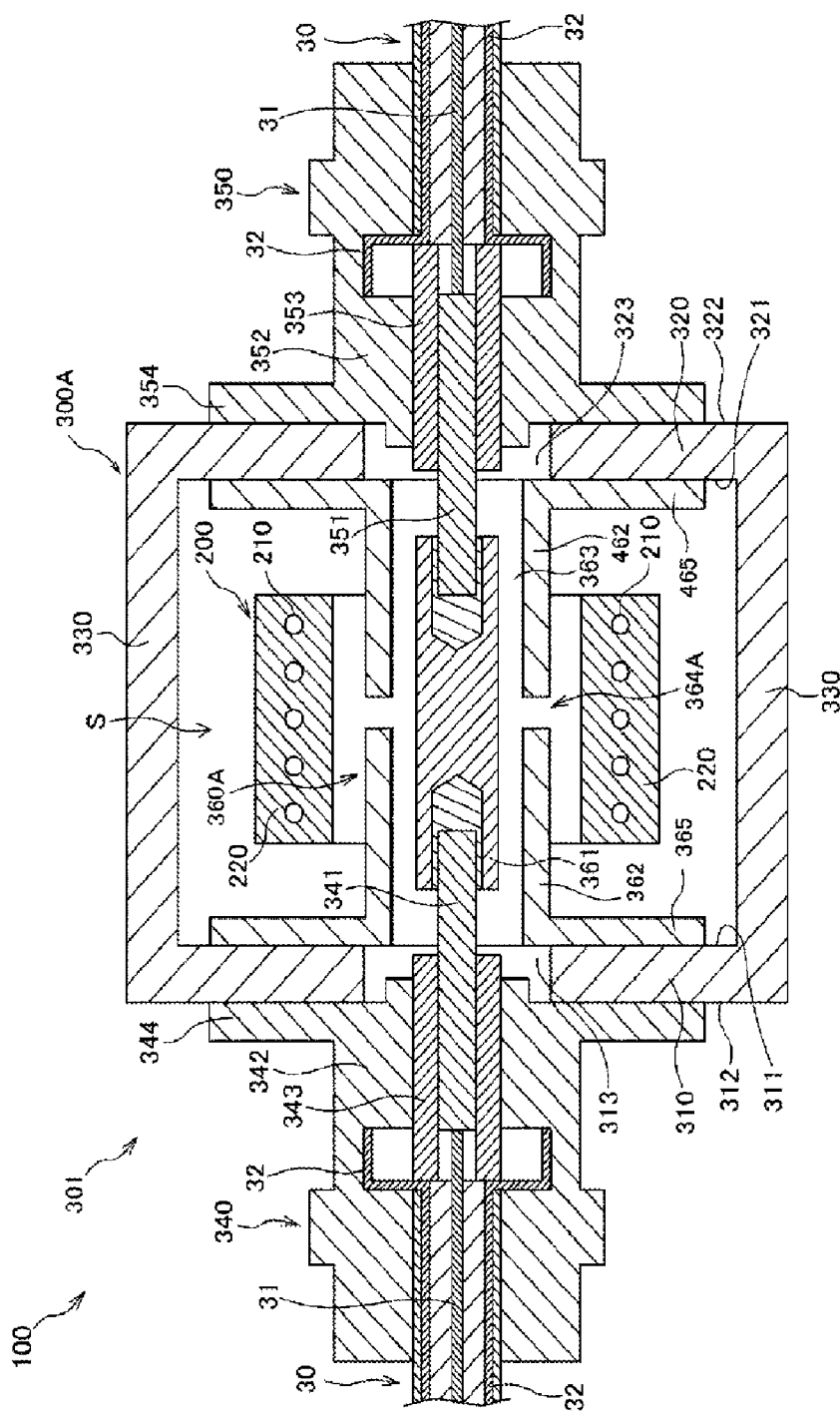
FIG. 8 is a diagram illustrating a modified example of a transmission path constituting the current measurement instrument.

Next, a modified example of the current measurement instrument 300 according to the first embodiment will be described with reference to FIG. 8. FIG. 8 is a cross-sectional view illustrating the structure of a current measurement instrument 301, which is a modified example of the current measurement instrument 300.

The current measurement instrument 301 according to the present modified example includes a transmission path 360A instead of the transmission path 360 of the current measurement instrument 300 illustrated in FIGS. 2 to 5. The transmission path 360A includes, in addition to the tube-like portion 362 with the distal end retracted toward the first side surface portion 310, a tube-like portion 462 and a flange 465 that projects from the base end portion of the tube-like portion 462 in the radial direction. As illustrated in FIG. 8, other configurations are the same as the configurations of the current measurement instrument 300, and thus the same reference signs are used and redundant descriptions are omitted.

The tube-like portion 462 extends in the longitudinal direction of the connection portion 361 from the inner surface 321 of the side surface portion 320. The distal end of the tube-like portion 462 is spaced apart from and opposes the distal end of the tube-like portion 362.

A gap 364A formed between the distal end of the tube-like portion 362 and the distal end of the tube-like portion 462 is formed in an intermediate region between the pair of side surface portions 310 and 320. In a similar manner to the current measurement instrument 300, the length of the gap 364A is designed to be less than the width of the current sensor 200 so that noise emitted from the connection portion 361 is suppressed. Also, in a similar manner to the flange 365, the flange 465 is fixed to the inner surface 311 of the side surface portion 310.

By providing the tube-like portion 462 opposing the tube-like portion 362 in this manner, the gap 364A formed at the distal end of the tube-like portion 362 is formed in an intermediate region between the pair of side surface portions 310 and 320. With this configuration as well, noise emitted from the connection portion 361 to the space S can be suppressed and a magnetic field produced by an alternating current flowing through the connection portion 361 can be produced in the space S of the current measurement instrument 301.

Note that in the present modified example, the housing 300A constituted by the pair of side surface portions 310 and 320 and the bridging portion 330 is a conductor. However, for the housing 300A, it is sufficient that the body portions 342 and 352 of the pair of coaxial connectors 340 and 350 are electrically connected. Thus, the body portions 342 and 352 of the pair of coaxial connectors 340 and 350 may be electrically connected via a process of attaching a conduction portion to the surfaces of the pair of side surface portions 310 and 320 and the bridging portion 330, which have insulating properties, or a process of applying a conductive material.

Second Embodiment

Figure 9:
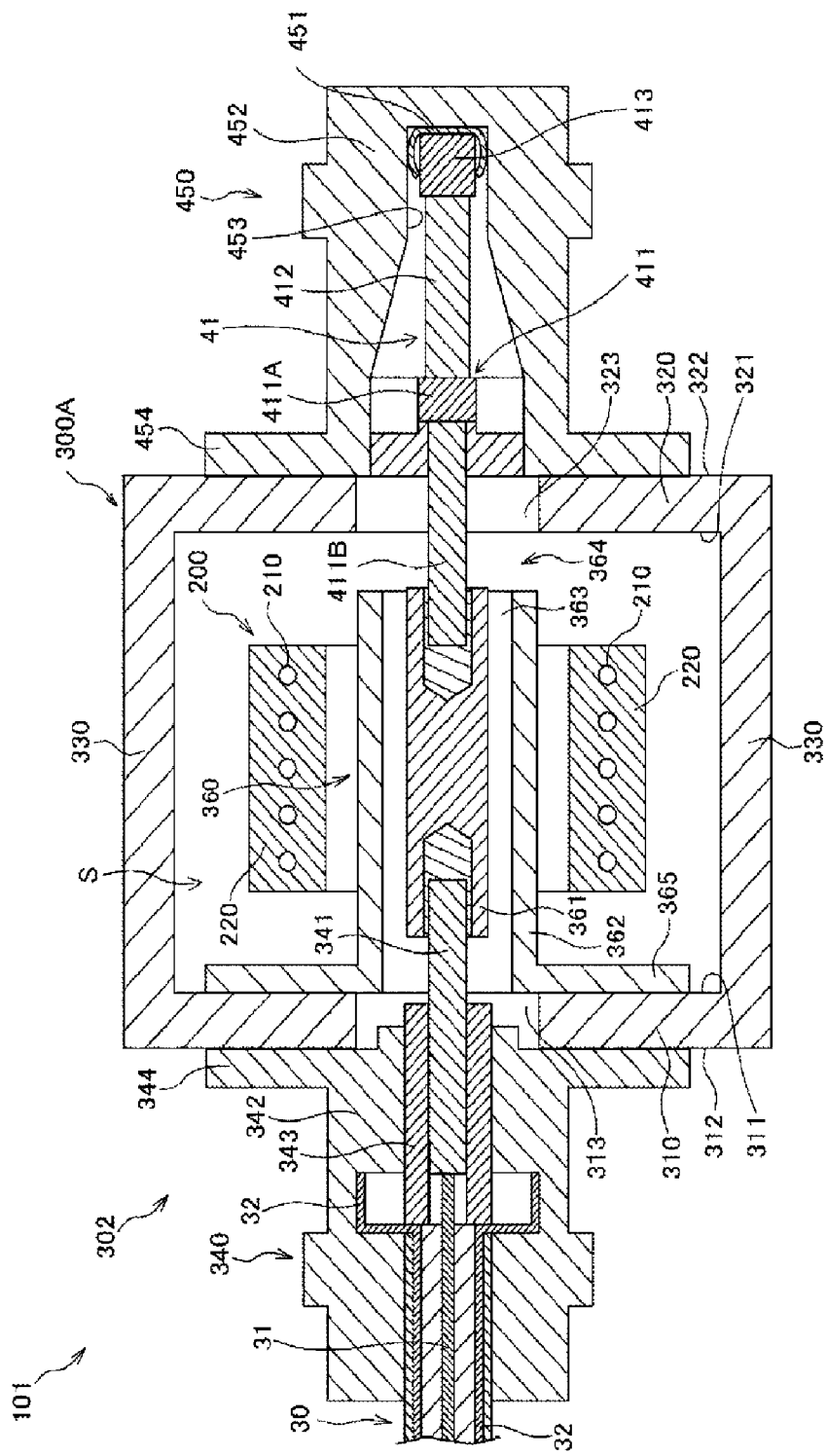
FIG. 9 is a cross-sectional view illustrating the structure of a current measurement device according to a second embodiment.

FIG. 9 is a cross-sectional view illustrating the structure of a current measurement device 101 according to the second embodiment. The current measurement device 101 includes the current sensor 200 illustrated in FIGS. 2 and 3 and a current measurement instrument 302.

In the present embodiment, the current measurement instrument 302 includes a terminator 450 instead of the coaxial connector 350. The other configurations are the same as the configurations of the current measurement instrument 300 illustrated in FIGS. 2 to 5. Thus, configurations that are the same as those of the current measurement instrument 300 are given the same reference numerals, and the descriptions are omitted.

The terminator 450 is a coaxial component for terminating one end of the transmission path 360 of the current measurement instrument 302. In the present embodiment, the terminator 450 is a connector component having a termination resistance and houses the termination resistor 41 illustrated in FIGS. 1 and 6.

As illustrated in FIG. 9, the termination resistor 41 is constituted by a first electrode body 411, a resistor body 412, and a second electrode body 413 constituting the inner conductor of the coaxial component. The first electrode body 411 includes a first electrode 411A and a pin 411B projecting from the first electrode 411A in the extending direction of the resistor body 412.

The terminator 450 includes the termination resistor 41 described above, a spring electrode 451 that covers the second electrode body 413 of the termination resistor 41, and a body portion 452 that houses the termination resistor 41 and the spring electrode 451. The terminator 450 further includes a hole portion 453 that opens from the distal end portion of the body portion 452 and a flange 454 that projects from the distal end portion of the body portion 452 in the radial direction. Note that the second electrode body 413, the spring electrode 451, and the body portion 452 of the terminator 450 constitute the outer conductor of the coaxial component.

The spring electrode 451 is configured to be fit into a bottom portion of the hole portion 453, and the body portion 452 is constituted by a conductor. The termination resistor 41 is press-fitted to the bottom surface of the hole portion 453 so that the spring electrode 451 is in contact with the bottom surface. Accordingly, the termination resistor 41 is fixed to the body portion 452, and the pin 411B of the termination resistor 41 projects from the body portion 452.

Also, although not illustrated in FIG. 9, in a similar manner to the flange 344 illustrated in FIGS. 4 and 5, in the flange 454, a plurality of threaded holes are formed, and the terminator 450 is fixed to the outer surface 322 of the side surface portion 320 by screws inserted into the threaded holes.

The terminator 450 configured as described above is attached to the outer surface 322 of the second side surface portion 320, with the pin 411B constituting the first electrode body 411 passing through the hole portion 323 of the second side surface portion 320. Further, the connection portion 361 electrically connects the pin 341 constituting the inner conductor of the coaxial connector 340 and the pin 411B constituting a portion of the inner conductor of the terminator 450.

Also, in a similar manner to the first embodiment, the pair of side surface portions 310 and 320 and the bridging portion 330 are electrically conductive such that the body portion 342 constituting the outer conductor of the coaxial connector 340 and the second electrode body 413 of the terminator 450 are electrically connected. Furthermore, the tube-like portion 362 is electrically connected at the base end portion to the first side surface portion 310 and electrically separated at the distal end portion from the body portion 452 of the terminator 450 attached to the second side surface portion 320.

Note that in the present embodiment, the gap 364 is formed on the side near the side surface portion 320 of the tube-like portion 362. However, no such limitation is intended. For example, as illustrated in FIG. 8, the gap 364 may be formed in the intermediate region between the pair of side surface portions 310 and 320.

Now, the power loss of the current measurement instrument 302 according to the present embodiment will be described with reference to FIG. 10.

Figure 10:
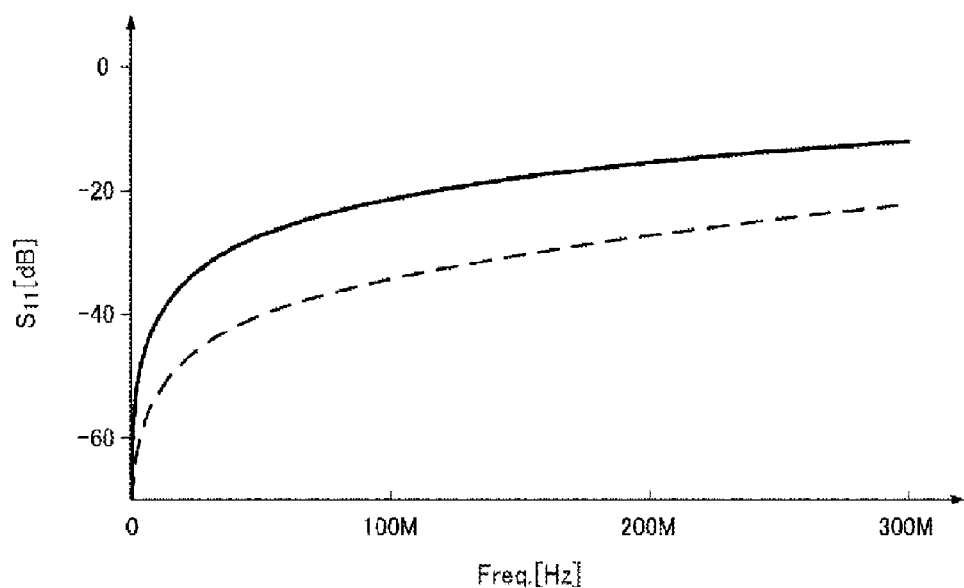
FIG. 10 is a diagram for describing power loss that occurs in the current measurement instrument.

FIG. 10 is a diagram for describing the relationship between frequency (Hz) of the alternating current flowing from the coaxial cable 30 to the transmission path 360 via the coaxial connector 340 of the current measurement instrument 302 and power loss (dB) of the current measurement instrument 302.

In FIG. 10, the frequency characteristic of an input reflection coefficient S11 of the current measurement instrument 302 is represented by a solid line, and, as a comparative example, the frequency characteristic of the input reflection coefficient S11 of a comparative instrument without the tube-like portion 362 is represented by a dashed line.

In the example shown in FIG. 10, the characteristic impedance Z0 of the coaxial cable 30 is 50Ω, and the value of the termination resistor 41 inside the terminator 450 attached to the current measurement instrument 302 is 50Ω. Also, instead of the terminator 450, a different terminator that short-circuits the housing 300A and the connection portion 361 is attached to the comparative instrument.

As shown in FIG. 10, the input reflection coefficient S11 of the current measurement instrument 302 according to the present embodiment approaches zero as the frequency of the alternating current flowing through the transmission path 360 increases. In other words, the higher the frequency of the alternating current flowing through the coaxial cable 30, the smaller the power loss in the current measurement instrument 302.

Also, it is clear that the input reflection coefficient S11 of the current measurement instrument 302 is better than the input reflection coefficient S11 of the comparative instrument across all frequencies. This is because, not only is reflection of the alternating current at the terminator 450 suppressed, but also the electromagnetic waves leaking from the connection portion 361 to the space S of the housing 300A is reduced by providing the tube-like portion 362 electrically connected to the housing 300A in the current measurement instrument 302.

Now, the effects of the second embodiment will be described.

In the present embodiment, the current measurement instrument 302 includes the pair of side surface portions 310 and 320 disposed spaced apart and opposing one another and the bridging portion 330 bridging between the pair of side surface portions 310 and 320. The current measurement instrument 302 further includes the coaxial connector 340 that is attached to the first side surface portion 310 and includes the pin 341, which is an inner conductor, extending through the hole portion 313 formed in the first side surface portion 310, and the terminator 450 that is attached to the second side surface portion 320 and includes the pin 411B constituting the first electrode body 411 extending through the hole portion 323 formed in the second side surface portion 320.

The coaxial connector 340 and the terminator 450 constitute a pair of coaxial components. In the present embodiment, in one of the coaxial components, the inner conductor is implemented by the pin 341 of the coaxial connector 340 and the outer conductor is implemented by the body portion 342 of the coaxial connector 340. In the other coaxial component, the inner conductor is implemented by the first electrode body 411 of the terminator 450 and a portion of the outer conductor is implemented by the second electrode body 413 of the terminator 450.

The current measurement instrument 302 further includes the connection portion 361 that electrically connects the pin 341 of the coaxial connector 340 and the pin 411B of the terminator 450, and the tube-like portion 362 that encloses the outer peripheral portion of the connection portion 361, with a gap formed between the tube-like portion 362 and the outer peripheral portion of the connection portion 361. Also, the pair of side surface portions 310 and 320 and the bridging portion 330 are electrically conductive such that the body portion 342, which is the outer conductor of the coaxial connector 340, and the second electrode body 413 of the terminator 450 are electrically connected. Furthermore, the tube-like portion 362 includes the base end portion electrically connected to the first side surface portion 310 and the distal end portion electrically separated from the second electrode body 413 of the terminator 450 attached to the second side surface portion 320.

According to this configuration, in a similar manner to the first embodiment, the bridging portion 330 is provided between end portions of the pair of side surface portions 310 and 320. This allows electrical paths, electronic components, and other components different from the coaxial cable 30 connected to the coaxial connector 340 to be physically separated from the connection portion 361 inside the current measurement instrument 302. Thus, noise entering the space S formed by the pair of side surface portions 310 and 320 and the bridging portion 330 can be reduced. This allows the current transmitted from the coaxial cable 30 to the current measurement instrument 302 to be accurately measured.

Also, in a similar manner to the first embodiment, since the pair of side surface portions 310 and 320 and the bridging portion 330 are electrically conductive, noise that may enter the space S inside the housing 300A from outside the current measurement instrument 302 can be easily blocked. Furthermore, since the tube-like portion 362 is disposed enclosing the outer peripheral portion of the connection portion 361, electric fields and electromagnetic fields produced from the connection portion 361 can be kept inside the tube-like portion 362.

Also, the pair of side surface portions 310 and 320, the bridging portion 330, and the tube-like portion 362 are electrically connected to one another. Thus, in the space S inside the housing 300A, noise caused by a difference between an electrical potential at the pair of side surface portions 310 and 320 and the bridging portion 330 and an electrical potential at the tube-like portion 362 can be reduced.

In a similar manner to the first embodiment, in the present embodiment, since the tube-like portion 362 is provided and the tube-like portion 362 is electrically connected to the pair of side surface portions 310 and 320 and the bridging portion 330, noise entering the space S inside the current measurement instrument 302 can be reduced. Accordingly, a current flowing through the current measurement instrument 302 can be accurately measured.

Also, in the present embodiment, the current measurement device 101 includes the current sensor 200 that detects a current flowing through a measurement target, and the current measurement instrument 302 described above. The bridging portion 330 forms the space S between the pair of side surface portions 310 and 320, and the current sensor 200 is disposed inside the space S enclosing the tube-like portion 362 and detects the current transmitted through the connection portion 361.

According to this configuration, in a similar manner to the first embodiment, noise entering the current sensor 200 disposed in the space S inside the current measurement instrument 300 is reduced. Thus, a current flowing through the connection portion 361 can be accurately measured by using the current sensor 200.

Also, in the present embodiment, the structure of the tube-like portion 362 and the connection portion 361 is configured to have the same characteristic impedance as those of the coaxial connector 340 and the terminator 450. This makes it possible to reduce the reflection that occurs at the current measurement instrument 302 when a high-frequency current flows through the coaxial cable 30. Accordingly, a current transmitted from the coaxial cable 30 to the tube-like portion 362 and the connection portion 361 of the current measurement instrument 302 can be accurately measured.

Also, in a similar manner to the first embodiment, in the present embodiment, the pair of side surface portions 310 and 320 and the bridging portion 330 are conductors. According to this configuration, the current measurement instrument 302 can be easily manufactured without requiring a process of attaching a conduction portion to the surfaces of the pair of side surface portions 310 and 320 and the bridging portion 330, or a process of applying a conductive material.

In a similar manner to the first embodiment, in the present embodiment, the gap 364 provided at the distal end of the tube-like portion 362 in the direction between the pair of side surface portions 310 and 320 is narrower than the width of the current sensor 200 disposed between the pair of side surface portions 310 and 320. According to this configuration, the exposed portion of the connection portion 361 can be reduced, and thus noise, such as electric fields and electromagnetic fields, radiated from the exposed portion can be reduced.

Also, in a similar manner to the first embodiment, in the present embodiment, the tube-like portion 362 extends from the inner surface 311 of the first side surface portion 310 and is spaced apart from the second side surface portion 320 to form the gap 364. According to this configuration, since the gap 364 is formed at or near the second side surface portion 320, the current sensor 200 can be disposed separated from the gap 364. Thus, noise, such as electric fields and electromagnetic fields, emitted from the exposed connection portion 361 toward current sensor 200 can be reduced.

Figure 11:
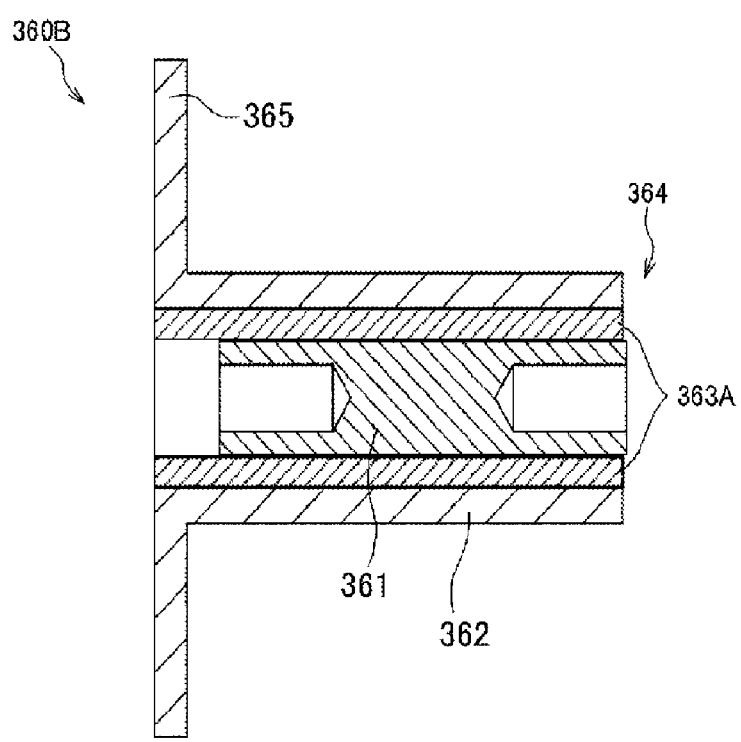
FIG. 11 is a cross-sectional view illustrating a modified example of a transmission path constituting the current measurement instrument.

Also, as illustrated in FIG. 11, the current measurement instrument 302 constituting the current measurement device 100 according to the present embodiment may include, between the connection portion 361 and the tube-like portion 362, a dielectric 363A having a dielectric constant less than that of air. In this manner, compared to the transmission path 360 including the hollow portion 363, the distance between the connection portion 361 and the tube-like portion 362 can be reduced, allowing the current measurement instrument 302 to be made smaller in size.

Note that, in the present embodiment, the coaxial connector 340 is attached to the first side surface portion 310 and the terminator 450 is attached to the second side surface portion 320. However, the terminator 450 may be attached to the first side surface portion 310 and the coaxial connector 340 may be attached to the second side surface portion 320. In this case, the tube-like portion 362 includes the base end portion electrically connected to the first side surface portion 310 and the distal end portion electrically separated from the body portion 342, which is the outer conductor of the coaxial connector 340 attached to the second side surface portion 320.

Also, in the present embodiment, the terminator 450 including the termination resistor 41 is attached to the side surface portion 320. However, a terminator that short-circuits the transmission path 360 of the current measurement instrument 302 may be attached to the side surface portion 320. In a similar manner to the present embodiment, this configuration also can reduce noise produced in the space S inside the current measurement instrument 302.

Modified Example

Now, a modified example of the transmission path 360 constituting the current measurement instrument 302 according to the second embodiment will be described with reference to FIG. 11. FIG. 11 is a cross-sectional view illustrating the structure of a transmission path 360B, which is a modified example of the transmission path 360.

The transmission path 360B according to the present modified example includes, instead of the hollow portion 363 of the transmission path 360 illustrated in FIG. 9, the dielectric 363A having a dielectric constant less than that of the hollow portion 363. Polyethylene or the like may be used as the dielectric 363A, for example.

In this manner, compared to the transmission path 360 described above, for the transmission path 360B, the distance between the connection portion 361 and the tube-like portion 362 can be reduced, allowing the current measurement instrument 302 to be made smaller in size and allowing the current sensor 200 having a small annular portion 220 to be used.

Next, a current measurement method for measuring the current flowing through the coaxial connector 340 by using any one of the current measurement components of the current measurement instruments 300 to 302 according to the embodiments described above will be described with reference to FIG. 12.

Figure 12:
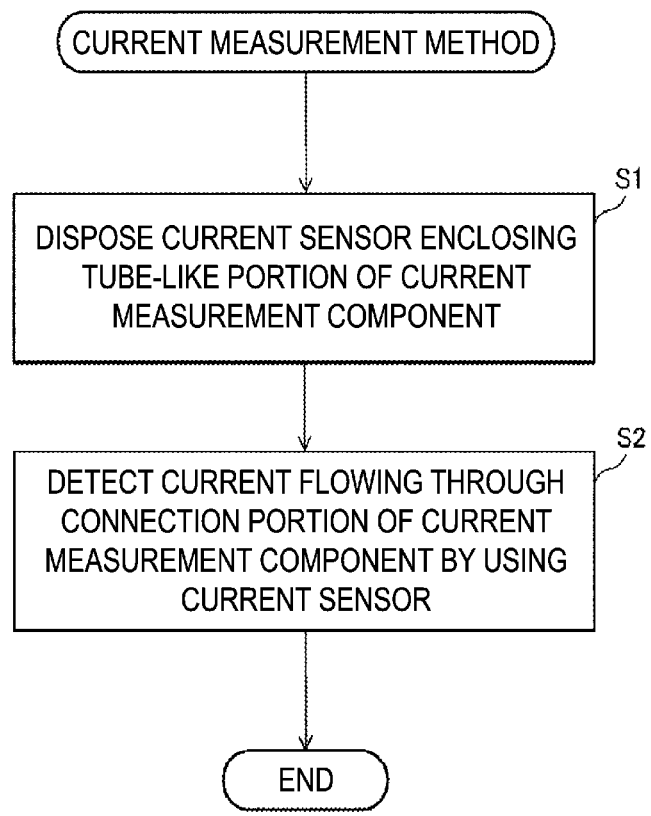
FIG. 12 is a flowchart illustrating an example of a current measurement method using the current measurement instrument.

FIG. 12 is a flowchart illustrating an example of a current measurement method using the current measurement instrument 300.

In this example, first, the coaxial cables 30 illustrated in FIG. 1 are connected to the pair of coaxial connectors 340 and 350 constituting the current measurement instrument 300. Note that in a case in which the current measurement instrument 302 is used, the coaxial cable 30 is only connected to the coaxial connector 340.

In step S1, the current sensor 200 is placed inside the space S formed between the pair of side surface portions 310 and 320 by the bridging portion 330, and the tube-like portion 362 is enclosed by the current sensor 200.

In step S2, the current flowing through the connection portion 361 of the current measurement instrument 300 is detected by using the current sensor 200. At this time, the current sensor 200 is electrically connected to a measuring instrument, and the measuring instrument, for example, measures the magnitude of the current flowing through the coaxial connector 340 on the basis of a detection signal output from the current sensor 200.

After the current flowing through the connection portion 361 is detected by the current sensor 200 and the current flowing through the coaxial connector 340 is measured by the measuring instrument, the current measurement method ends.

In this manner, the current measurement method includes measuring the current flowing through the coaxial components by using any one of the current measurement components of the current measurement instruments 300 to 302. In the current measurement component, the pair of side surface portions 310 and 320 and the bridging portion 330 are used to electrically connect the outer conductors of the pair of coaxial components, the base end portion of the tube-like portion 362 is electrically connected to the first side surface portion 310, and the distal end portion of the tube-like portion 362 is electrically separated from the outer conductor of the coaxial components at the second side surface portion 320. For example, one coaxial component is the coaxial connector 340, and the other coaxial component is the coaxial connector 350 or the terminator 450. In the second embodiment, one of the pair of coaxial components is the coaxial connector 340, and the other is the terminator 450. Also, the other inner conductor is the first electrode body 411 of the terminator 450, and the other outer conductor is the second electrode body 413 of the terminator 450.

The current measurement method includes step S1 in which the current sensor 200 is disposed inside the space S and the tube-like portion 362 is enclosed by the current sensor 200, and step S2 in which the current flowing through the connection portion 361 is detected by the current sensor 200.

According to this configuration, the tube-like portion 362 is electrically connected to the pair of side surface portions 310 and 320 and the bridging portion 330. Thus, noise entering the current sensor 200 disposed in the space S can be reduced. Accordingly, a current flowing through the connection portion 361 can be accurately measured.

The embodiments of the present invention described above merely illustrate a portion of the application examples of the present invention, and the technical scope of the present invention is not intended to be limited to the specific configurations of the embodiments described above.

For example, in the embodiments described above, the current measurement device 100, 101 is used to measure the current flowing through the coaxial cable 30. However, the current measurement device 100, 101 may be used to calibrate the current sensor 200. In this case, the current sensor 200 is calibrated by comparing an AC signal with high accuracy output from the AC device 10 and a measurement result obtained by the current sensor 200. Even in this case, the effect of noise entering the current sensor 200 can be reduced, allowing the current sensor 200 to be accurately calibrated.

In the embodiments described above, the housing 300A has a rectangular tube-like shape. However, the housing 300A can be formed concentric centered around the transmission path 360. Accordingly, a magnetic field concentric centered around the transmission path 360, 360A, 360B can be produced by the current flowing through the transmission path 360, 360A, 360B. Thus, since the current sensor 200 is disposed correctly in the current measurement instrument 301 to 303, the accuracy of the current sensor 200 detecting the current flowing through the transmission path 360, 360A, 360B can be increased.

Also, the modified example of the second embodiment illustrated in FIG. 11 can also be applied to the current measurement device 100, 101 of the first embodiment. In this case also, the outer diameter of the transmission path 360B can be decreased.

The present application claims priority based on JP 2020-109004 filed on Jun. 24, 2020 in Japan, and the present application claims priority based on JP 2021-080639 filed on May 11, 2021 in Japan, the entire contents of which are incorporated by reference herein.

REFERENCE SIGNS LIST 100, 101 Current measurement device
200 Current sensor
300 to 302 Current measurement instrument (current measurement component)
300A Housing
310, 320 Side surface portion (first side surface portion, second side surface portion)
311, 321 Inner surface
312, 322 Outer surface
313, 323 Hole portion
330 Bridging portion
340, 350 Coaxial connector (coaxial component)
341, 351 Pin (inner conductor)
342, 352, 452 Body portion (outer conductor)
361 Connection portion
362 Tube-like portion
363A Dielectric
364, 364A Gap 411 First electrode body (inner conductor)
411A First electrode (first electrode body)
411B Pin (first electrode body)
413 Second electrode body (outer conductor)
450 Terminator (coaxial component)

The invention claimed is:

1. A current measurement component comprising:
a pair of side surface portions disposed spaced apart and opposing one another;
a bridging portion bridging between the pair of side surface portions and forming a space between the pair of side surface portions;
a pair of coaxial components attached to the pair of side surface portions, respectively, each one of the pair of coaxial components including an inner conductor that extends through a hole formed in a corresponding side surface portion of the pair of side surface portions;
a connector electrically connecting the inner conductors of the pair of coaxial components; and
a tube enclosing an outer peripheral portion a connector perimeter of the connector with an insulating gap formed between the tube and the connector perimeter of the connector, wherein
the pair of side surface portions and the bridging portion are electrically conductive such that outer conductors of the pair of coaxial components are electrically connected, and
the tube includes a base end portion physically and electrically connected to a first side surface portion of the pair of side surface portions and a distal end portion physically and electrically separated from the outer conductor of a coaxial component of the pair of coaxial components attached to a second side surface portion of the pair of side surface portions.

2. The current measurement component according to claim 1, wherein
a structure including the tube and the connector has a characteristic impedance identical to a characteristic impedance of the pair of coaxial components.

3. The current measurement component according to claim 1, wherein the pair of side surface portions and the bridging portion are conductors.

4. The current measurement component according to claim 1, wherein
an insulating gap provided at a distal end of the tube is narrower than a width of a current sensor disposed between the pair of side surface portions.

5. The current measurement component according to claim 1, wherein
the tube extends from an inner surface of the first side surface portion and is spaced apart from the second side surface portion to form an insulating gap provided at a distal end of the tube.

6. The current measurement component according to claim 1, further comprising,
between the connector and the tube,
a dielectric having a dielectric constant less than a dielectric constant of air.

7. The current measurement component according to claim 1, wherein
the pair of coaxial components are coaxial connectors.

8. The current measurement component according to claim 1, wherein
one of the pair of coaxial components is a coaxial connector and the other coaxial component is a terminator;
the inner conductor of the other coaxial component is a first electrode body of the terminator; and
the outer conductor of the other coaxial component is a second electrode body of the terminator.

9. A current measurement device comprising:
the current measurement component according to claim 1; and
a current sensor disposed inside the space formed between the pair of side surface portions by the bridging portion and configured to detect a current flowing through the connector in a state in which the current sensor encloses the tube.

10. A current measurement method using a current measurement component including a pair of side surface portions disposed spaced apart and opposing one another,
a bridging portion bridging between the pair of side surface portions and forming a space between the pair of side surface portions,
a pair of coaxial components attached to the pair of side surface portions, respectively, each one of the pair of coaxial components including an inner conductor that extends through a hole formed in a corresponding side surface portion of the pair of side surface portions,
a connector electrically connecting the inner conductors of the pair of coaxial components, and
a tube enclosing an connector perimeter of the connector with an insulating gap formed between the tube and the connector perimeter of the connector,
outer conductors of the pair of coaxial components being electrically connected by using the pair of side surface portions and the bridging portion,
a base end portion of the tube being physically and electrically connected to a first side surface portion of the pair of side surface portions, and
a distal end portion of the tube being physically and electrically separated from the outer conductor of a coaxial component of the pair of coaxial components at a second side surface portion of the pair of side surface portions, to measure a current flowing through the pair of coaxial components, the method comprising:
disposing a current sensor inside the space and enclosing the tube with the current sensor; and
detecting a current flowing through the connector with the current sensor.

11. The current measurement method according to claim 10, wherein
the pair of coaxial components are coaxial connectors.

12. The current measurement method according to claim 10, wherein
one of the pair of coaxial components is a coaxial connector and another is a terminator;
the inner conductor of the other coaxial connector is a first electrode body of the terminator; and
the outer conductor of the other coaxial connector is a second electrode body of the terminator.

* * * * *